United States Patent
Hao et al.

(10) Patent No.: US 9,824,172 B1
(45) Date of Patent: Nov. 21, 2017

(54) PERFORMANCE OF CIRCUITRY GENERATED USING HIGH-LEVEL SYNTHESIS

(71) Applicant: Xilinx, Inc., San Jose, CA (US)

(72) Inventors: Kecheng Hao, San Jose, CA (US); Hongbin Zheng, Singapore (SG); Stephen A. Neuendorffer, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/078,400

(22) Filed: Mar. 23, 2016

(51) Int. Cl.
   *G06F 17/50* (2006.01)
(52) U.S. Cl.
   CPC .................................. *G06F 17/505* (2013.01)
(58) Field of Classification Search
   CPC ........................... G06F 17/505; G06F 17/5045
   USPC ........................................ 716/100, 101, 105
   See application file for complete search history.

(56) References Cited

U.S. PATENT DOCUMENTS

| | | | |
|---|---|---|---|
| 7,509,619 B1* | 3/2009 | Miller et al. .......... | G06F 17/505 703/13 |
| 9,424,079 B2* | 8/2016 | Rossbach et al. .... | G06F 9/4843 |
| 2010/0070730 A1* | 3/2010 | Pop et al. ............ | G06F 8/4442 711/167 |
| 2015/0347654 A1 | 12/2015 | Han et al. | |

OTHER PUBLICATIONS

Specification and drawings for U.S. Appl. No. 15/078,347, filed Mar. 23, 2016, Hao et al.

* cited by examiner

*Primary Examiner* — Sun Lin
(74) *Attorney, Agent, or Firm* — Kevin T. Cuenot

(57) ABSTRACT

Implementing circuitry from an application can include determining a data flow of an application including a producer function, a loop construct, and a consumer function and creating a new function including contents of a body of the loop construct. A circuit design can be generated from the application including a producer function circuit block, a new function circuit block, and a consumer function circuit block. Control circuitry for each circuit block can be included within the circuit design. The control circuitry of the new function circuit block can initiate operation of the new function circuit block according to a loop induction variable of the loop construct.

20 Claims, 10 Drawing Sheets

US 9,824,172 B1

PERFORMANCE OF CIRCUITRY GENERATED USING HIGH-LEVEL SYNTHESIS

RESERVATION OF RIGHTS IN COPYRIGHTED MATERIAL

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

This disclosure relates to integrated circuits (ICs) and to implementing circuitry from applications using high-level synthesis.

BACKGROUND

High-level synthesis or "HLS" is an automated design process in which an application may be converted into a circuit design and digital circuitry. The application is typically written in a high level programming language such as C, C++, or the like. The application may be translated into a circuit design that may be specified as a register transfer level (RTL) description. The RTL description describes a synchronous digital circuit in terms of the flow of digital signals between hardware registers and the operations performed on those signals. The circuit design may be processed (e.g., synthesized, placed, and routed) through a design flow. Further, the processed circuit design may be implemented within an integrated circuit.

SUMMARY

A method of implementing circuitry from an application includes partitioning, using a processor, an array of the application into a plurality of virtual blocks according to a streaming dimension of the array and determining, using the processor, that a first function and a second function of the application that access the array have same access patterns for the virtual blocks of the array. The method includes including, using the processor, a first-in-first-out (FIFO) memory within a circuit design implementing the application. The FIFO memory couples a first circuit block implementing the first function with a second circuit block implementing the second function. The method includes including, using the processor, control circuitry within the circuit design. The control circuitry is configured to implement concurrent operation of the first circuit block and the second circuit block by controlling accesses of the first circuit block and the second circuit block to a plurality of buffers in the FIFO memory.

A system for implementing circuitry from an application includes a processor configured to initiate executable operations. The executable operations include partitioning an array of the application into a plurality of virtual blocks according to a streaming dimension of the array and determining that a first function of the application that accesses the array and a second function of the application that accesses the array have same access patterns for the virtual blocks of the array. The executable operations include including a FIFO memory within a circuit design implementing the application. The FIFO couples a first circuit block implementing the first function with a second circuit block implementing the second function. The executable operations include including control circuitry within the circuit design. The control circuitry is configured to implement concurrent operation of the first circuit block and the second circuit block by controlling accesses of the first circuit block and the second circuit block to a plurality of buffers in the FIFO memory.

A computer program product includes a non-transitory computer readable storage medium having program code stored thereon for implementing circuitry from an application. The program code is executable by a processor to perform operations. The operations include partitioning, using the processor, an array of the application into a plurality of virtual blocks according to a streaming dimension of the array and determining, using the processor, that a first function of the application that accesses the array and a second function of the application that accesses the array have same access patterns for the virtual blocks of the array. The operations include including, using the processor, a FIFO memory within a circuit design implementing the application, wherein the FIFO memory couples a first circuit block implementing the first function with a second circuit block implementing the second function and including, using the processor, control circuitry within the circuit design. The control circuitry is configured to implement concurrent operation of the first circuit block and the second circuit block by controlling accesses of the first circuit block and the second circuit block to a plurality of buffers in the FIFO memory.

A method of implementing circuitry from an application includes determining, using a processor, a data flow of an application having a producer function, a loop construct, and a consumer function, creating, using the processor, a new function including contents of a body of the loop construct, and generating, using the processor, a circuit design from the application including a producer function circuit block, a new function circuit block, and a consumer function circuit block. The method may include including, within the circuit design and using the processor, control circuitry for each circuit block, wherein the control circuitry of the new function circuit block initiates operation of the new function circuit block according to a loop induction variable of the loop construct.

A system for implementing circuitry from an application includes a processor configured to initiate executable operations. The executable operations include determining a data flow of an application including a producer function, a loop construct, and a consumer function, creating a new function including contents of a body of the loop construct, and generating a circuit design from the application including a producer function circuit block, a new function circuit block, and a consumer function circuit block. The executable operations include including, within the circuit design, control circuitry for each circuit block, wherein the control circuitry of the new function circuit block initiates operation of the new function circuit block according to a loop induction variable of the loop construct.

A computer program product includes a non-transitory computer readable storage medium having program code stored thereon for implementing circuitry from an application. The program code is executable by a processor to perform operations. The operations may include determining, using the processor, a data flow of an application having a producer function, a loop construct, and a consumer function, creating, using the processor, a new function including contents of a body of the loop construct, and generating, using the processor, a circuit design from the application including a producer function circuit block, a new function circuit block, and a consumer function circuit block. The operations may include including, within the circuit design and using the processor, control circuitry for each circuit block. The control circuitry of the new function circuit block initiates operation of the new function circuit block according to a loop induction variable of the loop construct.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

DETAILED DESCRIPTION OF THE DRAWINGS

Figure 1:
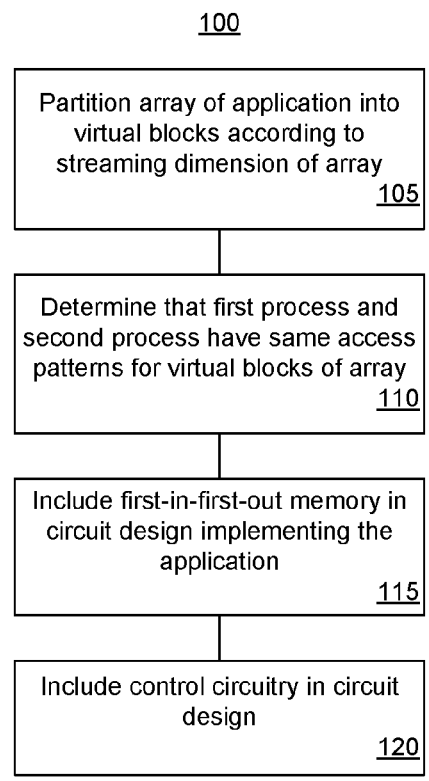
FIG. 1 is a flow chart illustrating an exemplary method of implementing a circuit design from an application.

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to integrated circuits (ICs) and to implementing circuitry from an application using high-level synthesis (HLS). In accordance with the inventive arrangements described herein, circuitry may be generated from an application. Using the HLS processing described herein, the resulting circuitry has increased data throughput, reduced latency, and/or utilizes fewer physical resources of the IC in which the circuitry is implemented than using other conventional HLS processing. The HLS processing described within this disclosure implements circuit architectures from an application where multiple circuit blocks operate concurrently as opposed to operating in serial. Circuit architectures that utilize memory streaming and/or pipelining, for example, may be used to implement applications where such circuit architectures were previously unavailable.

In implementing circuitry from an application, memory is used to pass data from a producer circuit to a consumer circuit. Conventional HLS processing attempts to stream the memory so that the producer circuit generates one scalar value and passes the scalar value to the consumer circuit through a first-in-first-out (FIFO) memory. In order to utilize this technique, the sequence of memory accesses by the producer circuit and the consumer circuit must strictly agree.

Strict agreement in memory accesses is not always applicable. One exemplary situation where strict agreement between producer circuit memory accesses and consumer circuit memory accesses is not applicable is frame-based video processing. In some cases, while the order in which frames are accessed by the producer circuit and the consumer circuit may strictly agree, the producer circuit and the consumer circuit may have different access patterns within the various frames. The memory access order at the pixel level within the frames, for example, does not strictly agree.

In these situations, the producer circuit generated using conventional HLS processing does not begin operation until the producer circuit completely finishes operation. As the producer circuit and the consumer circuit may be generated from functions in the application that are within loop constructs, the consumer circuit may be delayed significantly while waiting for the producer circuit to finish operating. In such an implementation, the size of the memory required to pass data from the producer circuit to the consumer circuit may be large. In an example where the producer circuit operates on M different frames through a loop with each frame having N elements, the memory used to couple the producer circuit with the consumer circuit would need to be sized to hold M×N elements.

In accordance with the inventive arrangements described within this disclosure, memory streaming may be implemented in cases where memory streaming was previously unavailable. For example, blocks of memory may be streamed among a producer circuit and a consumer circuit while allowing for random access to memory locations within each of the individual blocks. Accordingly, increased throughput is achieved for the resulting circuitry while also reducing the physical resources, i.e., the size of the memory, which is needed. Further, since random access within the blocks is maintained, the inventive arrangements provide increased flexibility that is applicable to a variety of different applications.

Pipelined circuit architectures may achieve higher data throughput and reduced latency in circuit designs. In some situations, one or more functions of an application that implements a data flow may be contained within a loop construct. In such cases, a pipelined circuit architecture may not be fully utilized. For example, the resulting pipelined circuit architecture may require that an instance of the function in circuitry complete operation before a next instance of the function (or another function of the data flow) in circuitry may begin operation.

In accordance with the inventive arrangements described herein, a pipelined circuit architecture may be implemented despite the data flow of an application being located within a loop construct, e.g., within a body of the loop construct. As implemented in circuitry, the pipelined circuit architecture may include multiple pipeline stages executing concurrently. A data consumer function within the loop construct, as implemented in circuitry, may begin operation on data provided from a data producer function in the loop construct, as implemented in circuitry, prior to the data producer function completing operations.

In accordance with another aspect of the inventive arrangements, block level memory streaming, as described herein, may be used to facilitate pipelined circuit architectures and concurrent operation of pipelined stages. For example, a data flow within a loop construct may be implemented to support concurrent operation of a data producer and a data consumer through the streaming of memory blocks. Further details are described below with reference to the drawings.

The inventive arrangements described herein may be implemented as a method or process performed by a data processing system. In another aspect, the inventive arrangements may be implemented as a data processing system having a processor. The processor, upon executing program code, may generate and/or implement a circuit design from an application. In still another aspect, the inventive arrangements may be implemented as a computer program product having a non-transitory computer-readable storage medium storing program code that, when executed, causes a processor and/or a system to perform operations as described within this disclosure.

For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

FIG. 1 is a flow chart illustrating an exemplary method 100 of implementing a circuit design from an application. Method 100 may be performed by a system, such as a data processing system or other computer, executing suitable program code. In general, the system may receive an application specified in a high level programming language (HLL) and generate a circuit design from the application. The circuit design may be specified as a register transfer level (RTL) description, e.g., using a hardware description language (HDL), as a netlist, or the like.

Method 100 may begin in block 105 where the system partitions an array of the application into a plurality of virtual blocks. The array may be a two-dimensional array. The system may partition the array into virtual blocks according to a streaming dimension of the array. In one aspect, the streaming dimension of the array is the dimension of the array where the sequence of accesses to the array by both a producer function and a consumer function of the application are the same. For example, the streaming dimension may be the left (or first) dimension of a two dimensional array.

The non-streaming dimension of the array is the dimension not selected as the streaming dimension. The non-streaming dimension of the array may also be referred to as the "random access dimension" of the array since the non-streaming dimension of the array is the dimension in which the sequence of accesses to the array by both the producer function and the consumer function are not the same. For example, the random access dimension of the array may be the right (or second) dimension of the two dimensional array. Accesses to memory locations by the producer function and the consumer function may be random and may not match.

Example 1 illustrates exemplary program code of an application that is to be processed through HLS. As shown, the program code operates on an array that includes M×N elements. For purposes of illustration, the program code may be for a frame-based video processing application where each frame M includes N elements with M and N each being integer values greater than one.

Example 1 int frames [M][N];
for (int i=0; i<M; ++i)
function1 (frames[i]);
for (int i=0; i<M; ++i)
function2 (frames[i]);

Accordingly, in block 105, the system may identify the array of size M×N within Example 1. The system may partition the array into M virtual blocks. The array may be streamed in the dimension of M having a size of N.

In block 110, the system may determine that a first function of the application that accesses the array and a second function of the application that accesses the array have same access patterns for the virtual blocks of the array. Example 1 includes two functions called "function1" (the first function) and "function2" (the second function). In processing Example 1, for purposes of creating a circuit architecture, the system may select the first occurring function "function1" as the producer function and the second occurring function "function2" as the consumer function.

In Example 1, each of the two functions is within a different loop construct. The sequence in which function1 and function2 access frames M is the same. The system, for example, may compare the conditions specified by each respective "for" loop in which function1 and function2 are located to determine that the sequences match. Within the frames, however, the system may determine that function1 and function2 access individual elements of M, e.g., pixels, in a different order. As such, the program code of Example 1 may not be implemented using streaming memory using conventional HLS processing techniques. Block level streaming as described herein may be used.

In block 115, the system may include a FIFO memory in a circuit design that implements the application. For example, the system may generate a circuit design that includes a circuit block representation of function1 and a circuit block implementation of function2. The term "circuit block," as used within this disclosure, means a module of a circuit design such as a module of RTL or the like. The system may insert an instance of a FIFO memory that couples a first circuit block implementing function1 and a second circuit block implementing function2. The FIFO memory may also include two or more buffers. In one arrangement, a buffer may be implemented as a bank of a memory. As such, a plurality of buffers may be implemented as a plurality of memory banks.

In block 120, the system may include control circuitry in the circuit design. In one aspect, the control circuitry may include control circuitry for the first circuit block implementing function1, control circuitry for the second circuit block implementing function2, and/or control circuitry for the FIFO memory. The control circuitry may include one or more circuit blocks configured to control access of the first circuit block and the second circuit block to the FIFO memory. The control circuitry further may control which buffer of the FIFO memory the first circuit block and the second circuit block access during operation at any given time. The control circuitry further may control access of the first circuit block and the second circuit block to the FIFO memory according to intra-virtual block accesses by each of the respective circuits.

Figure 2:
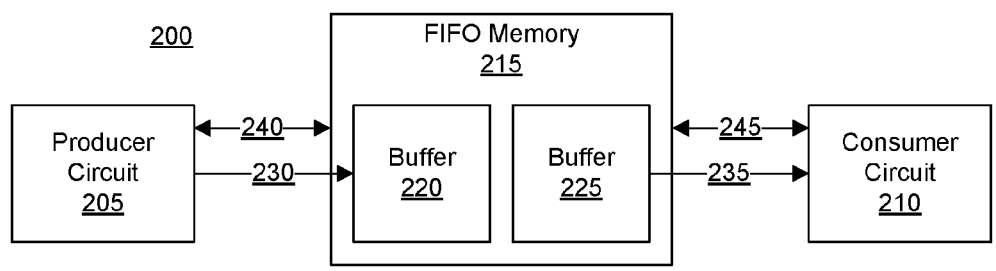
FIG. 2 is a block diagram illustrating exemplary circuitry that may be implemented from the program code of Example 1.

FIG. 2 is a block diagram illustrating exemplary circuitry 200 implemented from the program code of Example 1. Circuitry 200, for example, may be implemented within a target IC. In one example, the circuit design generated from the program code of Example 1 may be processed through a design flow (e.g., synthesis, placement, and routing) to generate a configuration bitstream. The configuration bitstream may be loaded into the target IC thereby implementing circuitry 200 within the target IC. In another aspect, the circuit design may be processed through a design flow for implementation as an application specific integrated circuit (ASIC).

As pictured, circuitry 200 includes a producer circuit 205, a consumer circuit 210, and a FIFO memory 215. Producer circuit 205 is a circuit implementation of function1 of Example 1. Consumer circuit 210 is a circuit implementation of function2 of Example 1. FIFO memory 215 couples producer circuit 205 with consumer circuit 210. As pictured, FIFO memory 215 includes two buffers 220 and 225. In one aspect, FIFO memory 215 may include more than two buffers. Further, the buffers may be sized to store one virtual block (e.g., a set of N elements of the array denoted by M).

The direction of data flow through circuitry 200 is illustrated by arrows 230 and 235 showing data moving from generator circuit 205 to consumer circuit 210 through FIFO memory 215. It should be appreciated, however, that producer circuit 205 and consumer circuit 210 may read and write to any buffers of FIFO memory 215 assigned to each respective circuit despite the direction of data flow. Signals 240 and 245 may be bi-directional control signals. Signals 240 and 245, for example, may include read enable signals, write enable signals, and/or signals to obtain, commit, and/or release buffers 220 and/or 225 of FIFO memory 215. In one aspect, signals 240 and 245 may be generated by control circuitry (not shown) that may be generated independently of, and/or included within, producer circuit 205 and consumer circuit 210. Additional control circuitry that may be included in FIFO memory 215 is not illustrated.

By using more than one buffer, i.e., buffers 220 and 225, FIFO memory 215 ensures that producer circuit 205 may write to one buffer while consumer circuitry 210 may read from another buffer. In this manner, the data of a two dimensional array may be streamed on a block level (e.g., virtual blocks into buffers) into FIFO memory 215. Intra-virtual block accesses by producer circuit 205 may only occur in a buffer controlled by producer circuit 205. Similarly, intra-virtual block accesses by consumer circuit 210 may only occur in a buffer controlled by consumer circuit 210. Accordingly, the intra-virtual block accesses by producer circuit 205 and/or consumer circuit 210 may occur in each respective buffer without affecting the block level streaming of data within circuitry 200.

Figure 3:
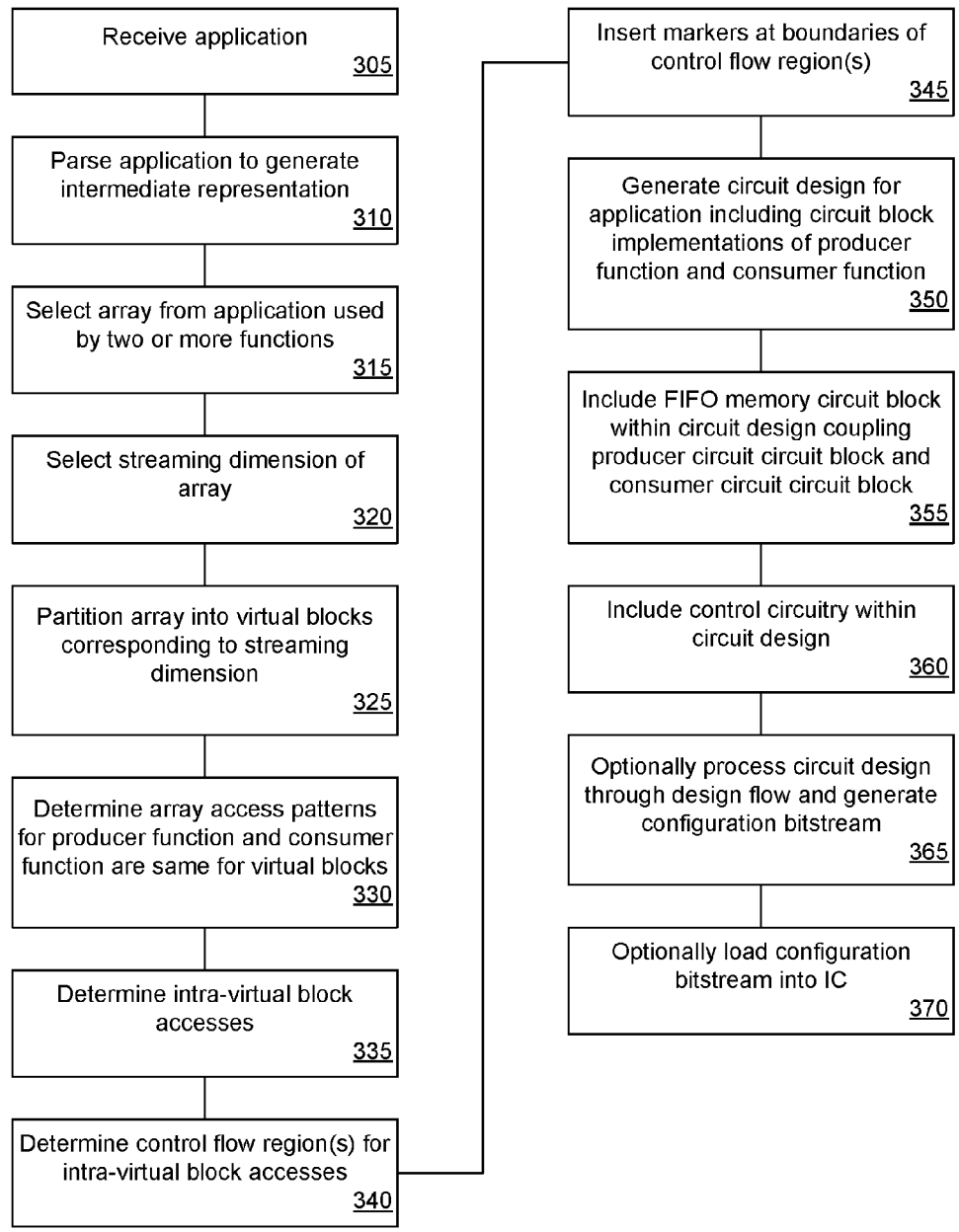
FIG. 3 is a flow chart illustrating another exemplary method of implementing a circuit design from an application.

FIG. 3 is a flow chart illustrating another exemplary method 300 of implementing a circuit design from an application. Method 300 may be performed by a system as generally described with reference to FIG. 1.

In block 305, the system may receive an application. The application, as noted, may be specified in an HLL. In block 310, the system may parse the application to generate an intermediate representation of the program code of the application. In one aspect, the system may generate an LLVM IR (Low Level Virtual Machine Intermediate Representation) of the application.

In block 315, the system may select an array from the program code that is used and/or accessed by two or more functions. For example, the system may select an array that is used by a first function and also by a second function. In another aspect, the system may select an array where the first function accessing the array and the second function accessing the array are each contained within different loop constructs. The system may select the first function as the producer function and the second function as the consumer function to determine a circuit architecture. For purposes of illustration, consider an array A[i][j] within the application that is selected for processing by the system. The LLVM IR array address format of the array may be a "gep" instruction or "GetElementPtr A, 0, i, j".

In one exemplary implementation, the application may include a directive such as a pragma specifying a particular array and/or particular accesses to an array that are to be implemented using a streaming memory architecture. In another aspect, the directive may specify the streaming dimension of the array that is to be used by the system. The system may detect the directive within the application and, responsive thereto, perform HLS processing on the array to implement block-level streaming.

In block 320, the system may select the streaming dimension of the array. In one aspect, the system may select the left dimension as the streaming dimension automatically. Referring to the exemplary array of A[i][j], the system may select the "i" dimension as the streaming dimension. As noted, in another aspect, the system may select the streaming dimension of the array from a directive within the application that explicitly lists the streaming dimension of the array.

In block 325, the system may partition the array into a plurality of virtual blocks corresponding to the streaming dimension. Referring to the array of A[i][j], the system may partition the array into "M" different virtual blocks according to the "i" dimension.

In block 330, the system may determine that the array access patterns for the producer function and the consumer function are the same for the virtual blocks (e.g., the left dimension of the array). Using the LLVM IR, for example, the system may compare the array access pattern of the producer function to the array access pattern for the consumer function for the virtual blocks using the array addresses. In one aspect, the system need only check the streaming dimension since the random access dimension need not have matching access patterns.

Referring to the A[i][j] array example, the system may check the "i" dimension and need not check the "j" dimension since random accesses are permitted on the "j" dimension for the producer function and the consumer function. Referring to Example 1, the system need only check the "M" dimension.

In block 335, the system may determine intra-virtual block accesses. For example, the system may determine accesses by the producer function and the consumer function to memory locations within individual ones of the virtual blocks. Referring to the prior example of a frame-based video processing application, the system may determine accesses within frames by function1 (the producer function) and function2 (the consumer function). In one aspect, the system may determine the intra-virtual block accesses by identifying each access that has a same address in the streaming dimension (e.g., dimension "i" in Example 2 or dimension "M" in Example 1), but has a different address in the random access dimension (e.g., dimension "j" in Example 2 or dimension "N" in Example 1). In cases where the system detects different addresses on the streaming dimension, the system determines that there are different sets of intra-virtual block accesses for each individual address on the streaming dimension.

In block 340, the system may determine flow control region(s) for the intra-virtual block accesses. The flow control region is the portion of program code that includes the intra-virtual block accesses by the producer function and the consumer function. Each of the functions, for example, may have one or more such flow control regions.

In block 345, the system may insert markers at the boundaries of the flow control regions. The system may insert markers at the beginning and at the end of each flow control region for both the producer function and the consumer function. Example 2 illustrates the program code of Example 1 after the system has identified intra-virtual block accesses and the flow control regions.

Example 2

```
int frames [M][N];
for (int i=0; i<M; ++i) {
// Marker: begin access to frames[i]
function1 (frames[i]);
// Marker: end access to frames[i]
for (int i=0; i<M; ++i)
// Marker: begin access to frames[i]
function2 (frames[i]);
// Marker: end access to frames[i]
```

In Example 2, the system has inserted markers as "//Marker . . . " indicating the start and end of accesses to frames. In Examples 1 and 2, virtual memory blocks are equivalent to frames.

Example 3 is another exemplary portion of program code of an application that incorporates the A[i][j] array used in some of the examples above. Within Example 3, the system has inserted markers as described indicating the flow control regions.

Example 3

```
int A[N][M]; // Memory stream: the leftmost dimension is the stream dimension.
. . .
for (i=0; i<N; ++i) {
// Marker: begin access to frames[i]
A[i][0]=3;
for (j=0; j<M; ++j) {
A[i][(j+i) % M]=j;
}
```

```
// Marker: end access to frames[i]
}
. . .
```

Each marker inserted at a flow control region boundary indicates one or more operations regulating access to the FIFO memory and/or performed on the FIFO memory by a circuit block implementation of the function and/or control circuitry that is inserted into the circuit design. A marker indicating the beginning of a flow control region indicates that the circuit block implementation of the function within the flow control region requires exclusive access to a region of memory, i.e., a buffer within the FIFO memory. The marker indicating the beginning of the flow control region indicates that the system has determined that no intra-virtual block accesses to the array occur prior to the region begin marker.

A marker indicating the end of a flow control region indicates that the circuit block implementation of the function within the flow control region no longer requires access to the region of memory. The marker indicating the end of the flow control region indicates that no further accesses to the region of memory occur thereafter and that the region of memory may be committed or released.

In block 350, the system may generate a circuit design for the application that includes circuit block implementations of the producer function and the consumer function. In block 355, the system may include a FIFO memory circuit block within the circuit design. The FIFO memory circuit block may include at least two buffers. The FIFO memory circuit block couples the producer circuit block with the consumer circuit block.

In block 360, the system may include control circuitry within the circuit design. The system may include control circuitry for the producer circuit, the consumer circuit, and/or the FIFO memory. The system may generate and insert control circuitry into the circuit design based upon the locations of the markers within the program code, e.g., at the boundaries of the control flow region(s). The control circuitry may generate addresses to elements within the buffers of the FIFO memory based upon the non-streaming dimension. The control circuitry may implement handshake signaling to access a buffer within the FIFO memory for read and/or writing. Further, the control circuitry may control buffer handling within the FIFO memory.

Referring to Example 3, the system may generate control circuitry to determine whether the FIFO memory has an available buffer for reading and/or writing at the marker indicating the start of a flow control region. The system may generate the control circuitry to release and/or commit a buffer into the FIFO memory at the state represented by the marker indicating the end of a flow control region. For example, subsequent to completing all accesses to the frame "i" where the flow control region ends, the control circuitry may perform handshake signaling with the FIFO memory to cause the buffer written by the producer circuit to be provided to the consumer circuit.

In block 365, the system may optionally process the circuit design through a design flow and generate a configuration bitstream. In block 370, the system may optionally load the configuration bitstream into an IC. The system, for example, may be coupled to an IC and send the configuration bitstream to the IC. Loading the configuration bitstream specifying the circuit design into the IC physically implements the circuitry specified by the circuit design within the IC. In another aspect, the circuit design, after being processed through a design flow, may be used to implement an ASIC.

Figure 4:
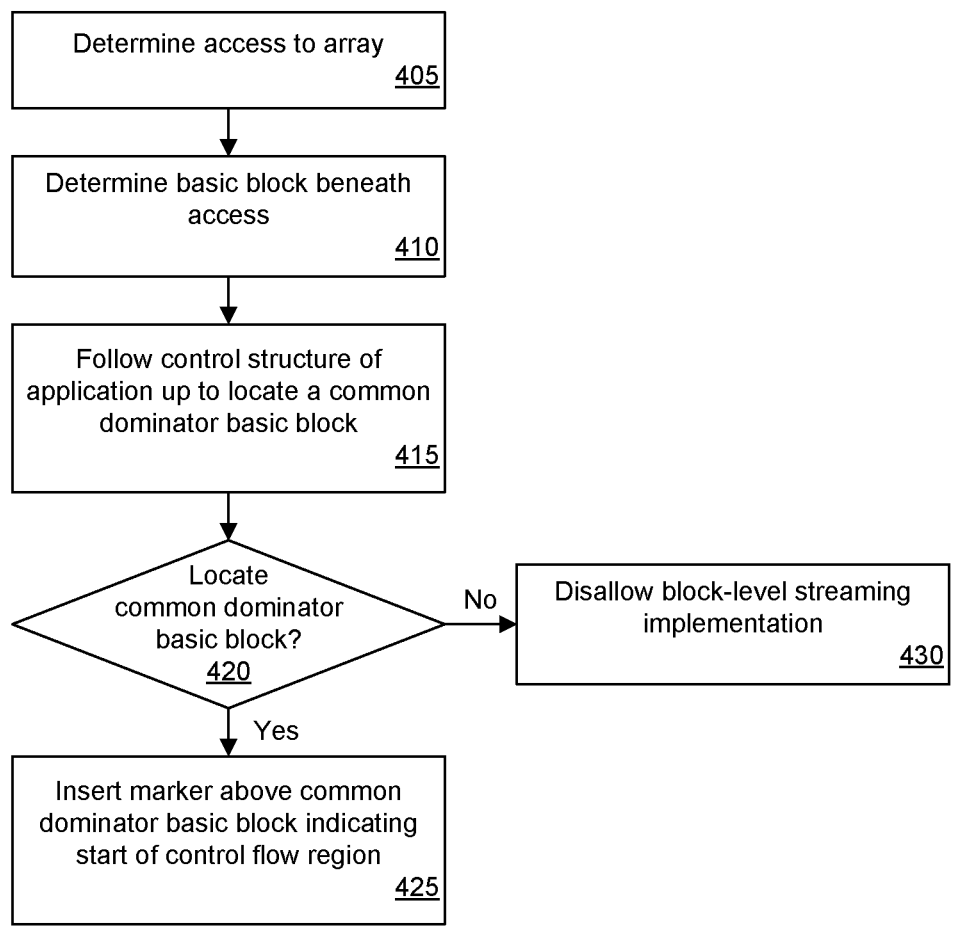
FIG. 4 is a flow chart illustrating an exemplary method of determining a boundary of a flow control region.

FIG. 4 is a flow chart illustrating an exemplary method 400 of determining a boundary of a flow control region. More particularly, method 400 illustrates an exemplary method of determining a beginning of a flow control region. As defined within this disclosure, a "flow control region" is a portion of an application including one or more instructions that access memory locations within a virtual block. In general, method 400 illustrates a process where the system determines a region of the program code prior to any access within a virtual block (e.g., "intra-virtual bock access").

Referring to Example 3, the system determines a region of program code that is prior to any access of region "i". The region prior to accesses within a virtual block may be said to dominate the intra-virtual block accesses and, as such, dominate the flow control region. The system may insert a marker at the location prior to any intra-virtual block accesses indicating the beginning of the flow control region. The end of the flow control region occurs after each access within a virtual block (e.g., after each access to region "i" in Example 3). It should be appreciated that while FIG. 4 describes a process for determining the start of the flow control region, method 400 may be readily adapted to identify the end of the flow control region.

In block 405, the system may determine accesses to the array within the application. In one example, the system may identify a loop construct that iterates using the non-streaming dimension of the array. Referring to Example 3, the system may identify the instruction "for (j=0; j<M; ++j) {".

In block 410, the system may determine the basic block beneath the access. As defined within this disclosure, the term "basic block" means a sequence of one or more instructions that do not include a control flow construct. In determining the basic block beneath the array access in Example 3, the system identifies the body of the "j" loop which is "A[i][(j+i) % M]=j;" as the basic block.

In block 415, the system follows the control structure of the application up to locate a common dominator basic block. In illustration, referring to Example 3, the system may traverse up from the body of the "j" loop to determine that the body is dominated by the "for" instruction. The system may continue traversing up the control structure of the application to locate the "A[i][0]=3;" instruction, which is determined to be a basic block. The system determines that this instruction is the basic block that dominates each access of the same location "i" in the array A.

In block 420, the system may determine whether a common dominator basic block is found or located. If so, method 400 may proceed to block 425. If not, method 400 may continue to block 430. In block 430, since no common dominator basic block is found, the system determines that block-level streaming may not be performed. The system may disallow the streaming implementation and terminate the process or otherwise implement a circuit where no streaming is used. In block 425, the system may insert a marker above the common dominator block indicating the start of the flow control region.

Example 4 illustrates exemplary pseudo code implementing method 400 of FIG. 4. The method of FIG. 4 and the pseudo code of Example 4 may be adapted to determine the end of the flow control region.

Example 4

Figure 5:
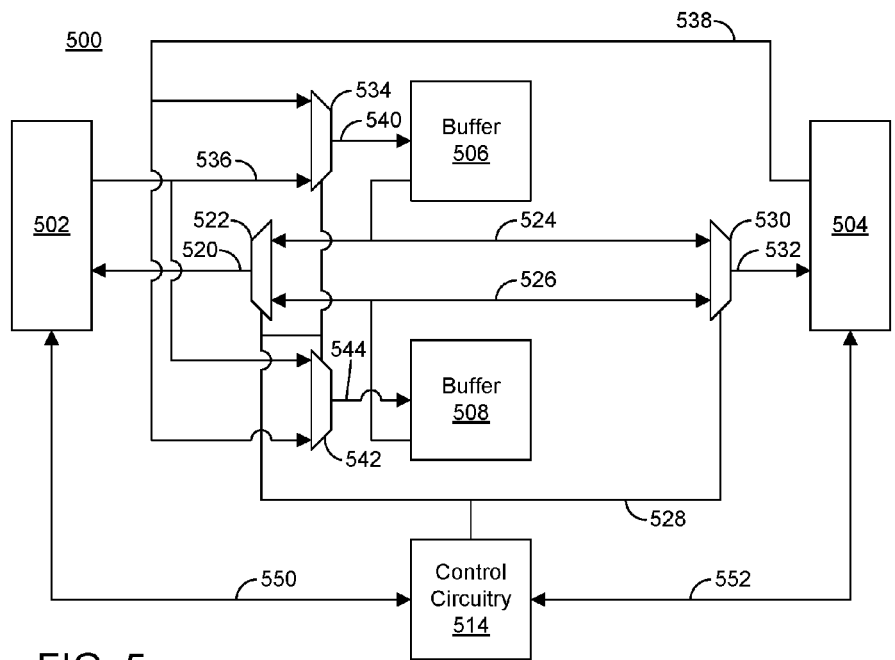
FIG. 5 is a block diagram illustrating exemplary circuitry.

BB=nullptr;
Foreach (Access a in A)
BasicBlock CurBlock=parent(a); // Get the current BasicBlock of access
a in the control-flow
If BB==nullptr then // Initialize the beginning
BB=CurBlock;
Else
// Find a place that dominate both BB and CurBlock. Because of the tree structure of the dominator tree, the
// common dominator of BB and CurBlock will dominate all previously visited accesses
BB=DT.findNearestCommonDominator(BB, CurBlock);
End
End
Return BB; //BB is what we are looking for FIG. 5 is a block diagram illustrating exemplary circuitry 500. Circuitry 500 may be generated by the system described herein from an application. For example, circuitry 500 may implement an application as illustrated in Example 2 or Example 3.

Circuitry 500 includes a producer circuit 502, a consumer circuit 504, a buffer 506, and a buffer 508. In the example of FIG. 5, the FIFO memory is implemented using two separate memories, i.e., buffers 506 and 508. Circuitry 500 also includes control circuitry 514. Producer circuit 502 receives signal 520 from multiplexer 522. Signal 520 may be a data output signal. As pictured, multiplexer 522 receives signals 524 and 526 from buffers 506 and 508, respectively. Multiplexer 522 passes either signal 524 or signal 526 responsive to control signal 528 as generated by control circuitry 514. Similarly, consumer circuit 504 is coupled to multiplexer 530 through signal 532. Multiplexer 530 passes either signal 524 or signal 526 as signal 532 responsive to control signal 528.

Producer circuit 502 is coupled to multiplexer 534 by signal 536. Consumer circuit 504 is also coupled to multiplexer 534 through signal 538. Multiplexer 534 passes signal 536 or signal 538 as signal 540 to buffer 506 responsive to control signal 528. In one exemplary implementation, signals 536 and 538 each may include a clock enable signal, a write enable signal, an address signal, and a data input signal. Further, producer circuit 502 is coupled to multiplexer 542 by signal 536. Consumer circuit 504 is also coupled to multiplexer 542 through signal 538. Multiplexer 542 passes signal 536 or signal 538 as signal 544 to buffer 508 responsive to control signal 528.

Control circuitry 514 also is configured to exchange signals 550 with producer circuit 502 and exchange signals 552 with consumer circuit 504. In one aspect, control circuitry 514 may be configured to regulate interaction of producer circuit 502 and consumer circuit 504 with buffers 506 and 508.

Control circuitry 514 may also be configured as the control circuitry for buffers 506 and 508, which in FIG. 5, form the FIFO memory. Signal 550, for example, may include a write request signal and a full signal. Producer circuit 502 may assert the write request signal to control circuitry 514 to request a buffer. Control circuitry 514 may assert the full signal to producer circuit 502 responsive to determining that no buffers are available (e.g., both are full). For example, producer circuit 502 may assert the write request signal (as part of signal 550) to control circuitry 514 to obtain a buffer if control circuitry 514 has not asserted the full signal (as part of signal 550). In asserting the write request signal while the full signal is not asserted, producer circuit 502 gains exclusive access to a buffer such as buffer 506. Control circuitry 514 makes a particular buffer available only to producer circuit 502. Producer circuit 502 maintains exclusive access to the buffer so long as the write request signal remains asserted and the full signal is not asserted. While producer circuit 502 has exclusive access to a buffer, producer circuit 502 may read and/or write to the buffer during that time.

Signal 552, for example, may include a read request signal and an empty signal. Consumer circuit 504 may assert the read request signal to control circuitry 514 to request a buffer. Control circuitry 514 may assert the empty signal to consumer circuit 504 responsive to determining that the buffers are empty. For example, consumer circuit 504 may assert the read request signal (as part of signal 552) to control circuitry 514 to obtain a buffer if control circuitry 514 has not asserted the empty signal (as part of signal 552) indicating that the FIFO memory has no data stored therein. In asserting the read request signal while the empty signal is not asserted, consumer circuit 504 gains exclusive access to a buffer such as buffer 508. Consumer circuit 504 maintains exclusive access to the buffer so long as the read request signal remains asserted and the empty signal is not asserted. While consumer circuit 504 has exclusive access to a buffer, consumer circuit 504 may read and/or write to the buffer during that time.

Control circuitry 514 may manage buffers 506 and 508. In one example, control circuitry 514 may include one or more queues used to manage the order in which buffers are provided to producer circuit 502 and consumer circuit 504. In illustration, control circuitry 514 may begin in a state where there are no buffers available for consumer circuit 504, i.e., the queue for consumer circuit 504 is empty. The queue for producer circuit 502 may include both of buffers 506 and 508. Producer circuit 502 may obtain exclusive access to buffer 506. After loading a frame into buffer 506 and performing any necessary processing, producer circuit 502 may release buffer 506. Responsive to producer circuit 502 releasing buffer 506, control circuitry 514 may remove buffer 506 from the queue for producer circuit 502 and place buffer 506 in the queue for consumer circuit 504.

If producer circuit 502 obtains access to buffer 508 and subsequently releases buffer 508 after loading and processing a frame, control circuitry 514 may remove buffer 508 from the queue for producer circuit 502 and add buffer 508 to the queue for consumer circuit 504. It should be appreciated that the ordering of buffers 506 and 508 in the queues is maintained. In this example, as consumer circuit 504 requests a buffer for processing, control circuitry 514 makes buffer 506 available to consumer circuit 502 prior to buffer 508 since buffer 506 entered the queue for consumer circuit 504 ahead of buffer 508. Similarly, when consumer circuit 504 releases buffer 506, control circuitry 514 removes buffer 506 from the queue for consumer circuit 504 and adds buffer 506 to the queue for producer circuit 502. In the case where the FIFO memory includes more than two buffers, control circuitry 514 may track the order in which buffers are loaded with data by producer circuit 502 to ensure that the buffers are consumed by consumer circuit 504 in the same order.

In generating control circuitry for circuitry 500, the system also includes control circuitry within producer circuit 502 and within consumer circuit 504. Control circuitry included in producer circuit 502 and consumer circuit 504 may perform the buffer requests, generate addresses for accessing memory locations within a buffer (e.g., intra-virtual block addresses), release buffers, and the like. As discussed, the operations described correspond to the beginning and ending of flow control regions. For example, producer circuit 502 obtains a buffer at the start of a flow control region and release the buffer at the end of the flow control region. Consumer circuit 504 obtains a buffer with data from producer circuit 502 at the start of a flow control region and releases the buffer at the end of the flow control region.

It should be appreciated that while FIG. 5 is illustrated as a two ported memory architecture, the circuit architecture may include more than two ports. In one example, each port may support more than one operation (e.g., read or write) per clock cycle thereby allowing each physical port to support a plurality of logical ports. In one aspect, the system performing HLS may generate circuitry conforming to the memory structure limitations or capabilities of the target IC in terms of number of physical and/or logical ports that may be used and/or included in a memory block. In the example of FIG. 5, the multiplexers are utilized for routing addressing and control signaling to the correct one of the buffers.

Figure 6:
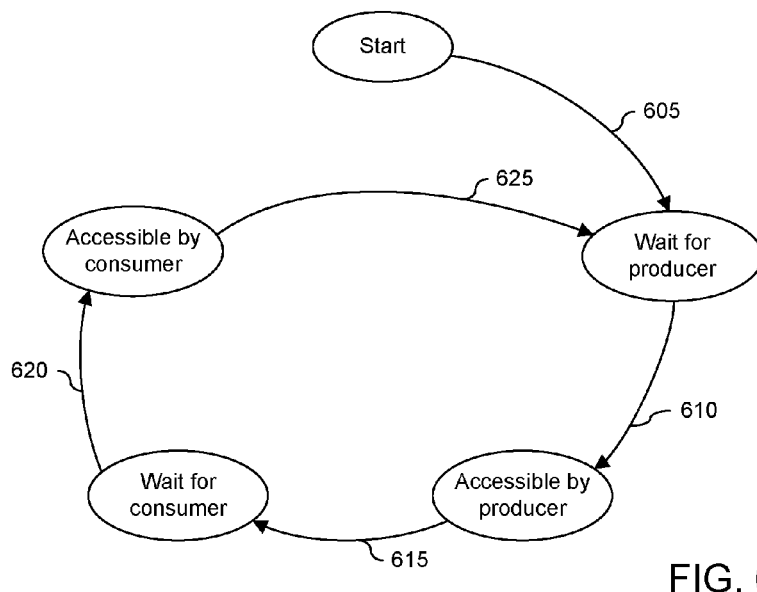
FIG. 6 is a diagram illustrating exemplary state transitions of a buffer memory.

FIG. 6 is a diagram illustrating exemplary state transitions of a buffer of a memory. More particularly, FIG. 6 illustrates exemplary state transitions for a single buffer in a FIFO as illustrated in FIG. 5. For example, FIG. 6 illustrates exemplary state transitions for buffer 506 or for buffer 508 as controlled by control circuitry 514 and the control signals generated by producer circuit 502 and/or consumer circuit 504.

As illustrated, the diagram begins in a start state and progresses through link 605 to a wait for producer state. The buffer is placed in a state awaiting data from the producer circuit. The control circuitry, for example, may place the buffer in the wait for producer state. Within FIG. 6, the buffer may not be accessed during the wait for producer state or the wait for consumer state. For instance, there may be other buffers, e.g., 10 other buffers, but only one buffer may be accessible by the producer circuit at a time and only one buffer accessible by the consumer circuit at a time.

The buffer may transition via link 610 to an accessible by producer state from the wait for producer state responsive to the producer circuit generating a write request. In the accessible by producer state, the buffer may be read and/or written only by the producer circuit. The producer circuit may not access the buffer in any other state. The producer circuit, for example, may generate and store data such as a frame for the consumer circuit within the buffer.

Responsive to the producer circuit releasing the buffer, e.g., upon finishing processing a frame or virtual block, the buffer transitions via link 615 to the wait for consumer state. When the consumer circuit is ready to process data in the buffer, the buffer transitions again via link 620 to the accessible by consumer state. In the accessible by consumer state, the buffer may be read and/or written only by the consumer circuit. The consumer circuit may not access the buffer in any other state. During the accessible by consumer state, the consumer circuit may process the data generated by the producer circuit that is stored in the buffer. Responsive to the consumer circuit releasing the buffer, e.g., upon finishing processing a frame or virtual block, the buffer transitions via link 625 to the wait for producer state. The state transitions may continue until all of the frames or virtual blocks are processed.

FIG. 6 is provided for purposes of illustration only. Other transitions may occur in cases where there is a different number of buffers. For example, in the case where the number of buffers is small or where the producer circuit or consumer circuit is stalled waiting for a buffer, it is possible to have transitions such as "accessible by producer" going directly to "accessible by consumer" and vice versa.

Figure 7:
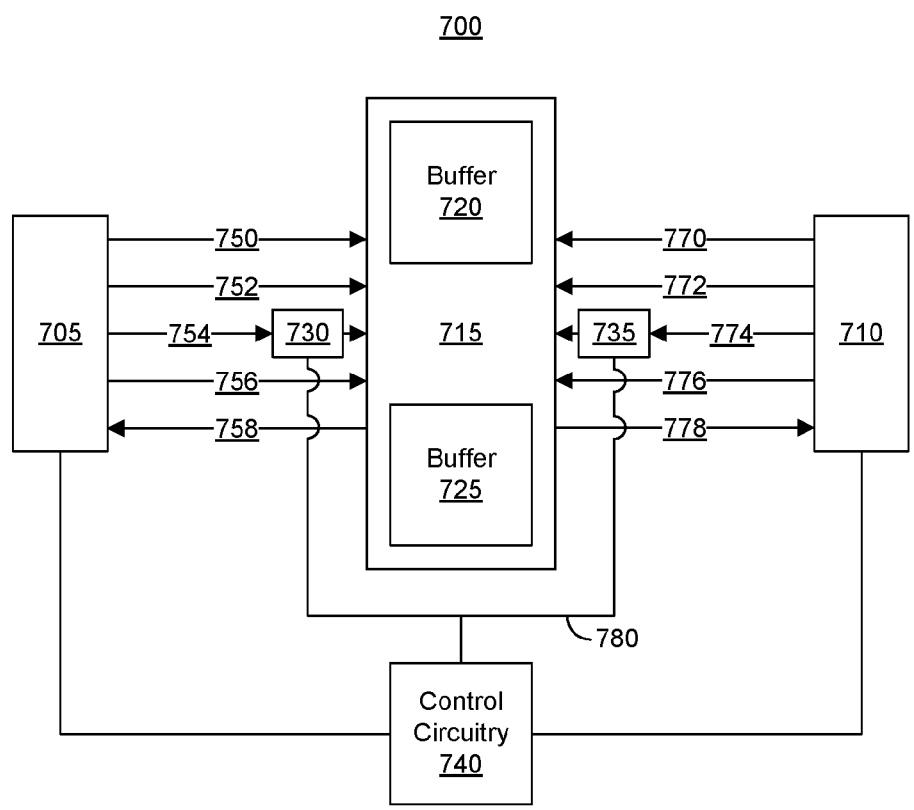
FIG. 7 is a block diagram illustrating exemplary circuitry.

FIG. 7 is a block diagram illustrating exemplary circuitry 700. Circuitry 700 may be generated by the system described herein from an application. For example, circuitry 700 may implement an application as illustrated in Example 2 or Example 3 in accordance with another aspect of the inventive arrangements described herein.

Circuitry 700 may include a producer circuit 705, a consumer circuit 710, a FIFO memory 715, and address generator circuits 730 and 735. In the example of FIG. 7, producer circuit 705 is coupled to consumer circuit 710 through FIFO memory 715. FIFO memory 715 includes a buffer 720 and a buffer 725. FIG. 7 illustrates an exemplary implementation where a single memory having two ports is used to implement multiple buffers rather than forming a FIFO memory from two physically separate memories as illustrated in FIG. 5.

As pictured, producer circuit 705 is coupled to FIFO memory 715 through signals 750, 752, 754, 756 and 758. Signal 750 may be a clock enable signal. Signal 752 may be a write enable signal. Signal 754 may be an address signal. Signal 756 may be a data input signal. Signal 758 may be a data output signal. Signal 754 is coupled to address generator circuit 730. Address generator circuit 730 is further coupled to control signal 780 from control circuitry 740.

In one arrangement, address generator circuit 730 is configured to receive a buffer index from control circuitry 740 specified by control signal 780 and an address (offset) within the buffer as specified by signal 754. Address generator circuit 730 generates a physical address into the FIFO memory 715 using the buffer index and the address. The physical address will be within either buffer 720 or buffer 725. Buffers 720 and 725 are delineated or defined within FIFO memory 715 according to address ranges. For example, the lower bits of the physical address may be provided via signal 754. The upper bits specifying the buffer selection may be provided by control signal 780.

Consumer circuit 710 is coupled to FIFO memory 715 through signals 770, 772, 774, 776 and 778. Signal 770 may be a clock enable signal. Signal 772 may be a write enable signal. Signal 774 may be an address signal. Signal 776 may be a data input signal. Signal 778 may be a data output signal. Signal 774 is coupled to address generator circuit 735. Control signal 780 is also provided to address generator circuit 735.

In one arrangement, address generator circuit 735 is configured to receive a buffer index from control circuitry 740 specified by control signal 780 and an address (offset) within the buffer as specified by signal 774. Address generator circuit 735 generates a physical address into the FIFO memory 715 using the buffer index and the address. The physical address will be within either buffer 720 or buffer 725. For example, the lower bits of the physical address may be provided via signal 774. The upper bits specifying the buffer selection may be provided by control signal 780.

In generating control circuitry for circuitry 700, the system also includes control circuitry within producer circuit 705 and within consumer circuit 710. Control circuitry included in producer circuit 705 and consumer circuit 710 may perform the buffer requests, generate addresses for accessing memory locations within a buffer (e.g., intra-virtual block addresses), release buffers, and the like. As discussed, the operations described correspond to the beginning and ending of flow control regions. For example, producer circuit 705 obtains a buffer at the start of a flow control region and release the buffer at the end of the flow control region. Consumer circuit 710 obtains a buffer with data from producer circuit 705 at the start of a flow control region and releases the buffer at the end of the flow control region. The additional control signals between control circuitry 740, producer circuit 705, and consumer circuit 710 may be used to perform further signaling described and/or other control signaling as may be required.

It should be appreciated that while FIG. 7 is illustrated as a two ported memory architecture, the circuit architecture may include more than two ports. In one example, each port may support more than one operation (e.g., read or write) per clock cycle thereby allowing each physical port to support a plurality of logical ports. In one aspect, the system performing HLS may generate circuitry conforming to the memory structure limitations or capabilities of the target IC in terms of number of physical and/or logical ports that may be used and/or included in a memory block.

As noted, in other arrangements, the application may include a data flow pipeline. In cases where the data flow pipeline is within a loop construct, the data flow pipeline may not be fully utilized. For purposes of illustration consider the portion of program code illustrated in Example 5 below. Within Example 5, the function "Func" is an example of a data flow pipeline.

Example 5

For (int i=0; i<5, ++i) {
Func( );
}

Figure 8:
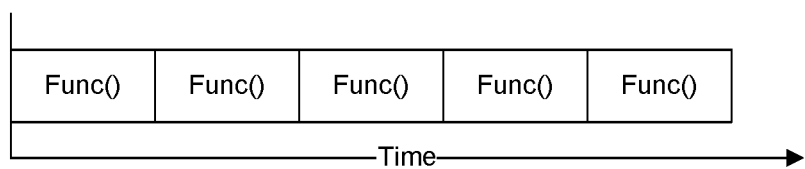
FIG. 8 is a Gantt chart illustrating exemplary execution of program code by a data processing system.
Figure 9:
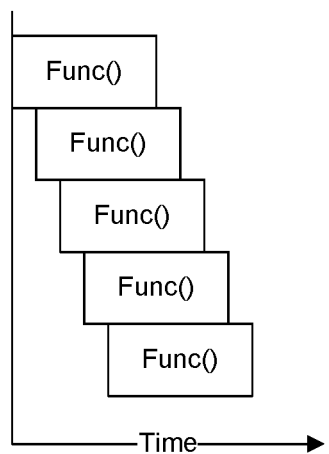
FIG. 9 is a Gantt chart illustrating exemplary operation of a circuit implementation of program code in accordance with an arrangement of the inventive arrangements described herein.

FIG. 8 is a Gantt chart illustrating how a data processing system would execute the program code of Example 5. A circuit architecture generated from the program code of Example 5 may use a single instance of a circuit block implementation of "Func( )". Still, the circuit block will execute the instance in the same manner as the code, iteratively for five separate operations to complete the loop. Neither the program code nor the resulting circuit architecture results in a pipelined architecture supporting concurrent or overlapping operation of pipeline stages. In accordance with the inventive arrangements described herein, circuitry may be implemented from an application that includes a data flow pipeline within a loop construct that utilizes a pipelined data flow to facilitate parallel execution.

FIG. 8 is a Gantt chart illustrating exemplary operation of a circuit implementation of the program code of Example 5 in accordance with the inventive arrangements described herein. As may be seen, FIG. 8 has a reduced latency compared to FIG. 7. FIG. 8 illustrates an arrangement where the system detects a data flow pipeline within a loop construct and determines that parallel operation is desired by the designer despite the application being written in a manner that does not indicate parallel operation.

Figure 10:
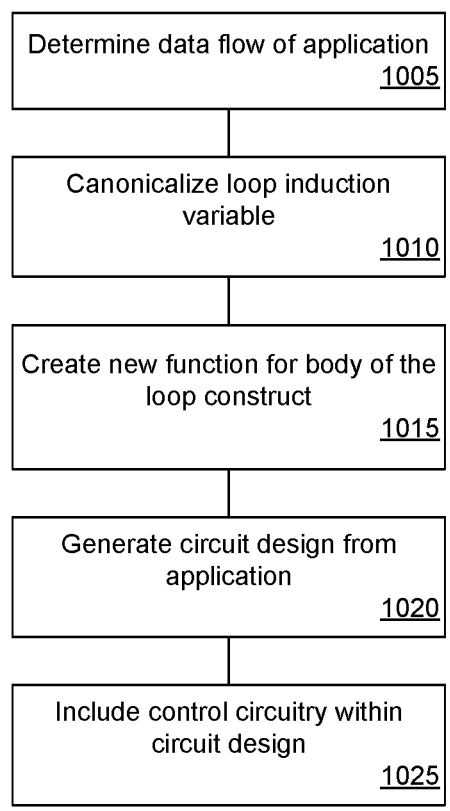
FIG. 10 is a flow chart illustrating another exemplary method of implementing a circuit design from an application.

FIG. 10 is a flow chart illustrating another exemplary method 1000 of implementing a circuit design from an application. Method 1000 may be performed by a system as described herein with reference to FIG. 1. In general, the system may receive an application that is to be implemented using circuitry. Method 1000 may begin in a state where the system may parsed the application to generate an intermediate representation of the application, e.g., an LLVM IR of the application.

In block 1005, the system may determine a data flow of the application. The data flow may include a producer function, a loop construct, and a consumer function. The loop construct may include one or more functions within a body of the loop construct. The function(s) within the loop may also implement a data flow that is part of the larger data flow including the producer function and the consumer function. Example 6 illustrates program code of an application having a data flow contained within a loop that is part of a larger data flow.

Example 6

```
Fun (int* in, int* out){
  proc1(in, t1);
  for(i=0;i<N;i=i+2){
    proc_loop1(t1, t2);
    proc_loop2(t2, t3);
  }
  proc2(t3, out);
}
```

In one aspect, the application may include a directive, e.g., a pragma, specifying a particular construct for which a data flow architecture is desired that supports pipelining. The system processes the loop construct to implement a data flow architecture while observing data dependencies within the application. In implementing the data flow architecture, the system implements circuit block level handshaking as opposed to centralized control over the circuit blocks.

In one exemplary implementation, referring to Example 6, the system may identify the data flow as a sequence of two (or more) functions where the output of a first function is provided as an input to a next function of the sequence. The functions "proc_loop1(t1, t2)" and "proc_loop2(t2, t3)" are an example of a data flow since the argument "t2" is an output of the first sequential function that is provided as an input to the next sequential function. The passing of data between the functions illustrates a data dependency between the two functions that must be preserved when generating circuit implementations of the program code. In Example 6, the system determines that parallel operation of proc_loop1 and proc_loop2 is desired. As noted, the system may determine that parallel operation is desired responsive to detection of a directive in the application.

In Example 6, the data flow formed of "proc_loop1(t1, t2)" and "proc_loop2(t2, t3)" is also contained within a larger data flow. As may be observed, the input to "proc_loop1(t1, t2)", which is "t1," is provided from "proc1(in, t1)" as an output from outside of the loop construct. The function "proc1" may be considered a producer function since the function generates data that is provided to the loop. Further, the output of "proc_loop2(t2, t3)", which is "t3," is provided to "proc2(t3, out)" as an input, thereby illustrating the larger data flow of which the "for" loop construct is an element. The function "proc2" is a consumer function since the function receives input from the loop construct.

In block 1010, the system may canonicalize the loop induction variable of the loop construct identified in block 1005. The system may transform, or rewrite, the loop to use a single induction variable that is incremented by one. In some cases, the loop induction variable may increment by a quantity larger than one. Synthesizing the loop without performing canonicalization may result in a more complex circuit and a larger circuit as the counter will need to be larger. Performing canonicalization prior to synthesis allows the system to create less complex circuitry that utilizes fewer physical resources.

In block 1015, the system may create a new function for the body of the loop construct. Referring to Example 6, the system may create a new function called "proc_loop" that includes "proc_loop1" and "proc_loop2". In general, the new function includes the contents of the body of the loop, whether the body includes one or more functions. In block 1020, the system may generate a circuit design from the application. The system may create, within the circuit design, a circuit block for the various portions of the data flow. For example, the system may generate a circuit block implementation for each of the producer function, the new function (generated from the body of the loop construct), and the consumer function.

In block 1025, the system may include control circuitry within the circuit design. The system may generate and include control circuitry for the data flow pipeline within the circuit design. In one aspect, as part of block 1025, the system may determine the number of start signals required to implement the loop according to the loop induction variable. The system, for example, may generate control circuitry that uses a counter to generate the required number of start signals. In one aspect, the system may generate control circuitry for each of the producer circuit block, the new function circuit block, and the consumer circuit block.

Figure 11:
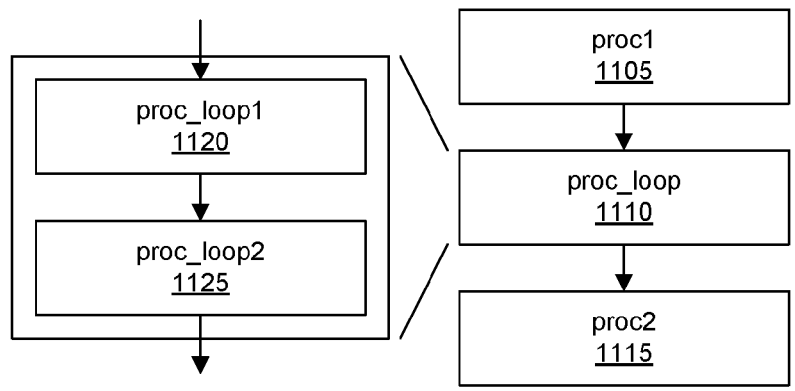
FIG. 11 is a block diagram illustrating the creation of a new function and synthesis of a data flow pipeline.

FIG. 11 is a block diagram illustrating the creation of a new function and synthesis of a data flow pipeline. FIG. 11 shows a circuit block implementation of the program code of Example 6. As pictured, the system has created a circuit block 1105 corresponding to the function "proc1" and a circuit block 1115 corresponding to the function "proc2". Circuit block 1105, as noted, is a producer circuit block while circuit block 1115 is a consumer circuit block. The system further has created a new function called "proc_loop". The new function includes "proc_loop1" and "proc_loop2". For example, the system may generate a new function that includes the body of the loop within the LLVM IR.

Within FIG. 11, the new function is transformed into a circuit block referred to as proc_loop circuit block 1110. In one arrangement, the circuit block created from the loop body may have a hierarchy that is the same as, or similar to, the newly created function. For example, proc_loop circuit block 1110 may include a proc_loop1 circuit block 1120 implementing the function "proc_loop1" and a proc_loop2 circuit block 1125 implementing the function "proc_loop2" as sub-circuit blocks within the hierarchy. It should be appreciated that within this disclosure, the various blocks described may be referred to as a "circuit block" or as "circuit blocks" using the corresponding reference number.

Figure 12:
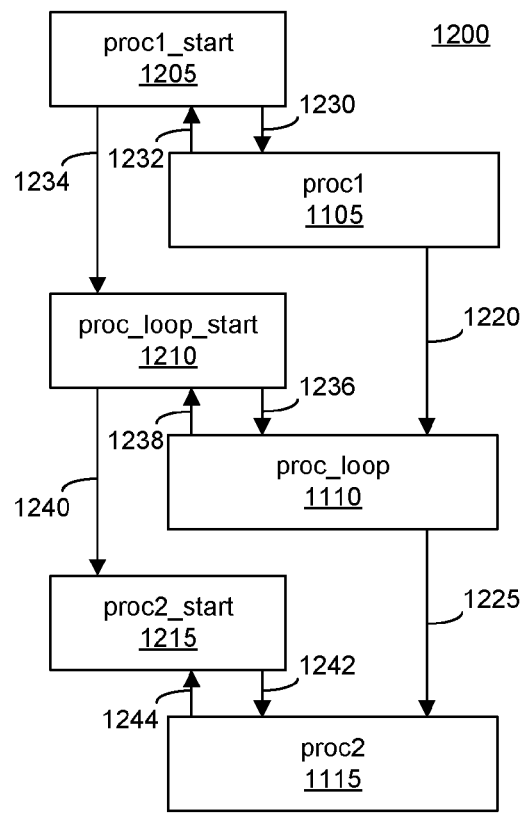
FIG. 12 is a block diagram illustrating an exemplary circuit architecture for implementing a data flow pipeline for an application.

FIG. 12 is a block diagram illustrating an exemplary circuit architecture 1200 for implementing a data flow pipeline for an application. Circuit architecture 1200 may be used to implement Example 6. As pictured, circuit architecture 1200 includes circuit block 1105, circuit block 1110, and circuit block 1115 as previously described with reference to FIG. 11. Circuit architecture 1200 further includes control circuitry implemented as proc1_start circuit block 1205, proc_loop_start circuit block 1210, and proc2_start circuit block 1215.

In the example of FIG. 12, being a data flow architecture, each of circuit blocks 1105, 1110, and 1115 has its own control circuit block. For example, circuit block 1205 may control the start of circuit block 1105. Circuit block 1210 may control the start of circuit block 1110. Circuit block 1215 may control the start of circuit block 1115. This architecture, with each circuit block having its own control circuitry to synchronize data transfers between the circuit blocks, may be particularly useful in cases where the constituent circuit blocks, e.g., circuit block 1105, 1110, and/or 1115, are complex in nature. As an example, circuit block 1105, 1110, and/or 1115 may include loops, which may complicate the flow of data through the circuitry.

Within FIG. 12, lines 1220 and 1225 represent data flows between circuit blocks 1105 and 1110 and between circuit blocks 1110 and 1115, respectively. Data flows 1220 and 1225 may be implemented by any of a variety of different data channel hardware. For example, data flows 1220 and 1225 may be implemented using FIFO memories, memory streaming channels as described with reference to FIG. 2 (e.g., a FIFO memory with multiple buffers), registers, or the like.

Signals 1230 and 1232 represent handshake signaling between circuit blocks 1205 and 1105. Circuit block 1205 may assert signal 1230 (e.g., a start signal) to circuit block 1105 to begin operation. Assertion of signal 1230 indicates to circuit block 1105 that the data to be used as input is available and ready. Accordingly, responsive to assertion of signal 1230, circuit block 1105 may begin operating. Responsive to completing operation, circuit block 1105 may assert signal 1232 (e.g., a ready signal) to circuit block 1205 indicating that circuit block 1105 is ready to process more data. Circuit block 1205 may propagate the state of circuit block 1105 to circuit block 1210 via signal 1234.

Referring to the program code of Example 6, it may be seen that circuit block 1105 is to operate one time. Accordingly, circuit block 1205 need only assert signal 1230 to circuit block 1105 one time.

Signals 1236 and 1238 represent handshake signaling between circuit blocks 1210 and 1110. Circuit block 1210 may assert signal 1236 (e.g., a start signal) to circuit block 1110 to begin operation. In one aspect, circuit block 1210 may assert signal 1236 responsive to circuit block 1205 indicating that circuit block 1105 has completed operation per signal 1234. Assertion of signal 1236 indicates to circuit block 1110 that the data to be used as input is available and ready. Accordingly, responsive to assertion of signal 1236, circuit block 1110 may begin operating. Responsive to completing operation, circuit block 1110 may assert signal 1238 (e.g., a ready signal) to circuit block 1210 indicating that circuit block 1110 is ready to process more data. Circuit block 1210 may propagate the state of circuit block 1110 to circuit block 1215 via signal 1240.

Referring again to the program code of Example 6, it may be seen that circuit block 1110 is to operate multiple times in accordance with the "for" loop construct. Circuit block 1110 executes while "i" is less than "N". In one aspect, the system may analyze the program code of the application to determine the number of times that the loop construct iterates. In creating the control circuitry, e.g., circuit block 1210, the system may configure a counter with the number of iterations of the loop body from the program code so that circuit block 1210 initiates operation of circuit block 1110 the correct number of times.

Circuit block 1210 may assert signal 1236 in accordance with the counter value. For example, circuit block 1210 may assert signal 1236, which may cause the counter to decrement (or increment depending upon the implementation). Responsive circuit block 1110 asserting signal 1238, circuit block 1110 may again assert signal 1236 and decrement the counter. The handshaking may continue as described so that circuit block 1110 is started the number of times determined from the "for" loop construct of the program code.

Signals 1242 and 1244 represent handshake signaling between circuit block 1215 and 1115. Circuit block 1215 may assert signal 1242 (e.g., a start signal) to circuit block 1115 to begin operation. In one aspect, circuit block 1215 may assert signal 1242 responsive to circuit block 1210 indicating that circuit block 1110 has completed the correct number of executions per signal 1240. Assertion of signal 1242 indicates to circuit block 1115 that the data to be used as input is available and ready. Accordingly, responsive to assertion of signal 1242, circuit block 1115 may begin operating. Responsive to completing operation, circuit block 1115 may assert signal 1244 (e.g., a ready signal) to circuit block 1215 indicating that circuit block 1115 is ready to process more data.

Figure 13:
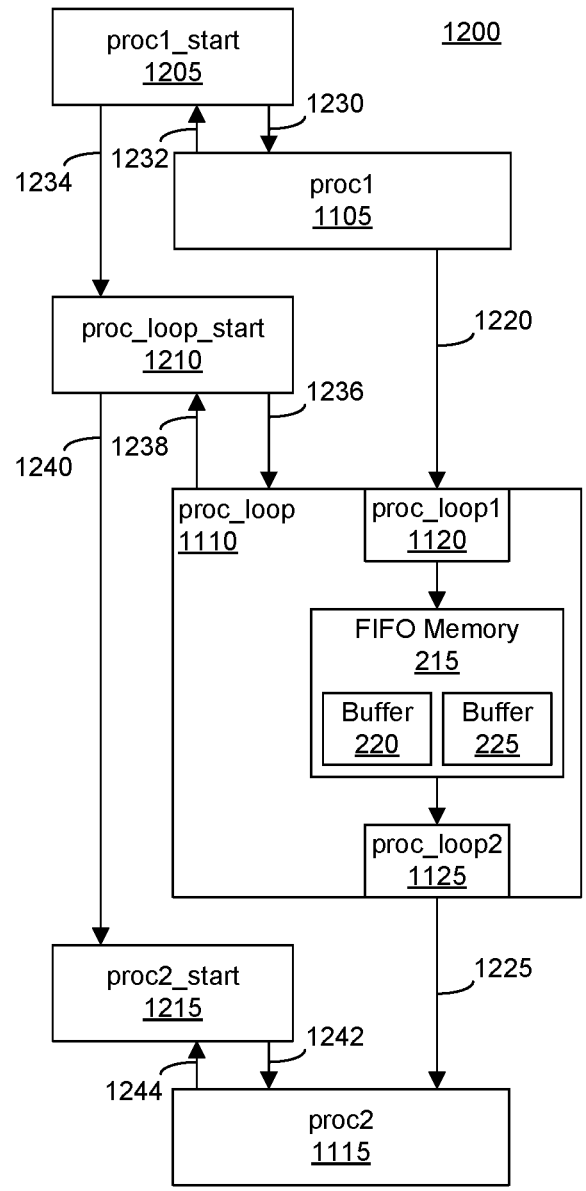
FIG. 13 is a block diagram illustrating a more detailed example of the circuit architecture of FIG. 12.

FIG. 13 is a block diagram illustrating a more detailed example of the circuit architecture 1200 of FIG. 12. Within FIG. 13, circuit block 1110 is shown in greater detail and utilizes the architecture illustrated in FIG. 2. As pictured, circuit block 1120 and circuit block 1125 may be coupled by FIFO memory 215. FIFO memory 215 includes at least two buffers 220 and 225. In one aspect, FIFO memory 215 may be implemented as described with reference to FIG. 5. In another aspect, FIFO memory may be implemented as described with reference to FIG. 6.

Figure 14:
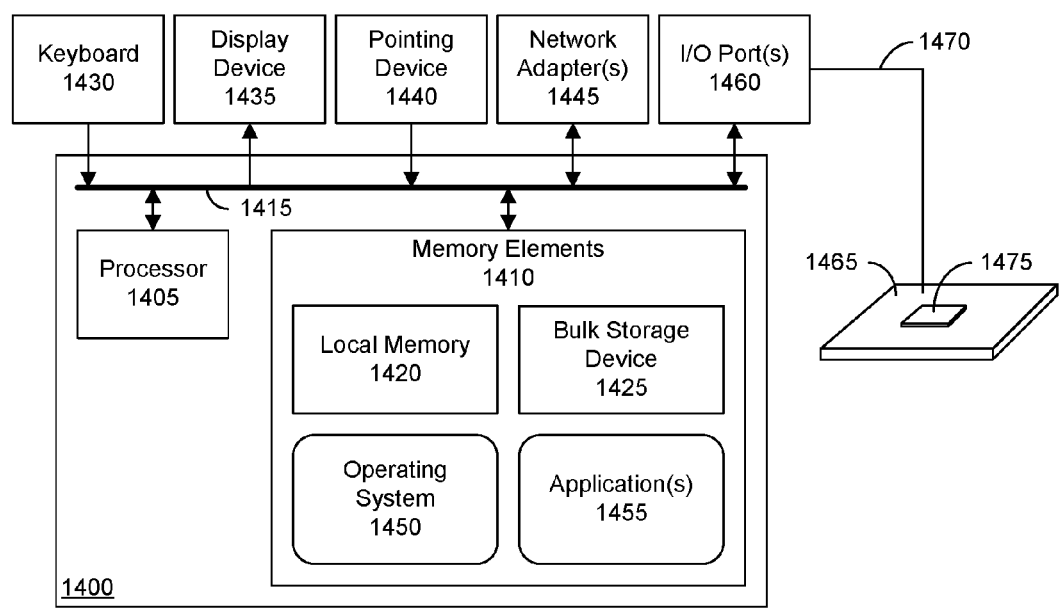
FIG. 14 is a block diagram illustrating an exemplary data processing system.

FIG. 14 is a block diagram illustrating an exemplary data processing system (system) 1400. System 1400 may be configured and used to perform the various operations described within this disclosure for implementing a circuit design from an application.

As pictured, system 1400 includes at least one processor, e.g., a central processing unit (CPU), 1405 coupled to memory elements 1410 through a system bus 1415 or other suitable circuitry. System 1400 stores computer readable instructions (also referred to as "program code") within memory elements 1410. Memory elements 1410 may be considered an example of computer readable storage media. Processor 1405 executes the program code accessed from memory elements 1410 via system bus 1415.

Memory elements 1410 may include one or more physical memory devices such as, for example, a local memory 1420 and one or more bulk storage devices 1425. Local memory 1420 refers to random access memory (RAM) or other non-persistent memory device(s) generally used during actual execution of the program code. Bulk storage device 1425 may be implemented as a hard disk drive (HDD), solid state drive (SSD), or other persistent data storage device. System 1400 may also include one or more cache memories (not shown) that provide temporary storage of at least some program code in order to reduce the number of times program code must be retrieved from bulk storage device 1425 during execution.

Input/output (I/O) devices such as a keyboard 1430, a display device 1435, a pointing device 1440, and one or more network adapter(s) 1445, and one or more I/O port(s) 1460 may be coupled to system 1400. The I/O devices may be coupled to system 1400 either directly or through intervening I/O controllers. In some cases, one or more of the I/O devices may be combined as in the case where a touchscreen is used as display device 1435. In that case, display device 1435 may also implement keyboard 1430 and pointing device 1440.

Network adapter 1445 may be used to couple system 1400 to other systems, computer systems, remote printers, and/or remote storage devices through intervening private or public networks. Modems, cable modems, Ethernet cards, and wireless transceivers and/or radios are examples of different types of network adapter 1445 that may be used with system 1400. Depending upon the particular implementation of system 1400, the specific type of network adapter, or network adapters as the case may be, will vary. Examples of I/O port(s) 1460 may include, but are not limited to, USB ports, FireWire ports, Display Ports, or the like. I/O ports 1460 allow system 1400 to become coupled to another system such as any of the aforementioned systems.

As pictured in FIG. 14, memory elements 1410 may store an operating system 1450 and one or more applications 1455. Application 1455, for example, may be an EDA application. In one aspect, operating system 1450 and application 1455, being implemented in the form of executable program code, are executed by system 1400 and, in particular, by processor 1405. As such, operating system 1450 and application 1455 may be considered an integrated part of system 1400. Operating system 1450, application 1455, and any data items used, generated, and/or operated upon by system 1400 are functional data structures that impart functionality when utilized by system 1400 and/or loaded into an IC.

In one aspect, system 1400 may be a computer or other device that is suitable for storing and/or executing program code. System 1400 may represent any of a variety of computer systems and/or devices that include a processor and memory and that are capable of performing the operations described within this disclosure. In some cases, the particular computer system and/or device may include fewer components or more components than described. System 1400 may be implemented as a single system as shown or as a plurality of networked or interconnected systems each having an architecture the same as, or similar to, that of system 1400.

System 1400 may optionally be coupled to a target platform 1465 through I/O port 1460. In another arrangement, system 1400 may be coupled to target platform 1465 through one of network adapters 1445. In any case, system 1400 is coupled to target platform 1465 through a communication link 1470. Communication link 1470 may be implemented as any of a variety of different wired and/or wireless connections. Exemplary wired implementations of communication link 1475 include, but are not limited to, point-to-point Ethernet, USB, FireWire, or the like. Exemplary wireless implementations of communication link 1475 include, but are not limited to, Bluetooth®, Wi-Fi®, or the like. In the case of a wireless implementation of communication link 1475, the connector of target platform 1465 may be implemented as a wireless transceiver. The exemplary communication links noted within this disclosure are provided for purposes of illustration only and not intended as limitations.

Target platform 1465 may be implemented as a circuit board such as a printed circuit board having circuitry implemented thereon. Target platform 115 may include a connector that couples to communication link 1470. The connector may be coupled, using circuitry of target platform 1465, to an IC 1475. IC 1475 may be coupled to target platform 1465 using a socket, a receptacle, another mounting technique such as soldering IC 1475 directly to target platform 1465, or the like. In any case, IC 1475 couples to communication link 1470 through target platform 1465. In one aspect, IC 1475 is a programmable IC. In another aspect, IC 1475 is a system-on-chip (SOC). IC 1475 may implement circuit designs that have been loaded therein. For example, system 1400 may generate a configuration bitstream as described specifying a circuit design that may be provided to IC 1475 and loaded therein thereby physically implementing the circuitry specified by the configuration bitstream.

The inventive arrangements described within this disclosure may be applied and/or used for high level synthesis flows to generate a circuit design from an application for implementation within an IC such as a programmable IC and/or an application specific integrated circuit (ASIC). Programmable ICs may be programmed to perform specified functions. One example of an IC that can be programmed is an FPGA. An FPGA typically includes an array of programmable tiles. These programmable tiles may include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect circuitry and programmable logic circuitry. The programmable interconnect circuitry typically includes a large number of interconnect lines of varying lengths interconnected by programmable interconnect points (PIPs). The programmable logic circuitry implements the logic of a user design using programmable elements that can include, for example, function generators, registers, arithmetic logic, and so forth.

The programmable interconnect and programmable logic circuitries are typically programmed by loading a stream of configuration data into internal configuration memory cells that define how the programmable elements are configured. The configuration data may be read from memory (e.g., from an external PROM) or written into the FPGA by an external device. The collective states of the individual memory cells then determine the function of the FPGA.

Another type of programmable IC is the complex programmable logic device, or CPLD. A CPLD includes two or more "function blocks" connected together and to input/output (I/O) resources by an interconnect switch matrix. Each function block of the CPLD includes a two-level AND/OR structure similar to those used in programmable logic arrays (PLAs) and programmable array logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable ICs, the functionality of the device is controlled by data bits provided to the device for that purpose. The data bits may be stored in volatile memory (e.g., static memory cells, as in FPGAs and some CPLDs), in non-volatile memory (e.g., FLASH memory, as in some CPLDs), or in any other type of memory cell.

Other programmable ICs are programmed by applying a processing layer, such as a metal layer, that programmably interconnects the various elements on the device. These programmable ICs are known as mask programmable devices. Programmable ICs may also be implemented in other ways, e.g., using fuse or antifuse technology.

The phrase "programmable IC" may include, but is not limited to these devices and further may encompass any IC that includes programmable circuitry is may be only partially programmable. For example, one type of programmable IC includes a combination of hard-coded transistor logic and a programmable switch fabric that programmably interconnects the hard-coded transistor logic. Another variety of programmable IC may include an SOC that includes a processor in combination with programmable circuitry. Another example of a programmable IC is an ASIC that includes programmable circuitry.

For purposes of explanation, specific nomenclature is set forth to provide a thorough understanding of the various inventive concepts disclosed herein. The terminology used herein, however, is for the purpose of describing particular aspects of the inventive arrangements only and is not intended to be limiting.

As defined herein, the singular forms "a," "an," and "the" are intended to include the plural forms as well, unless the context clearly indicates otherwise. As defined herein, the term "another" means at least a second or more. As defined herein, the terms "at least one," "one or more," and "and/or," are open-ended expressions that are both conjunctive and disjunctive in operation unless explicitly stated otherwise. For example, each of the expressions "at least one of A, B and C," "at least one of A, B, or C," "one or more of A, B, and C," "one or more of A, B, or C," and "A, B, and/or C" means A alone, B alone, C alone, A and B together, A and C together, B and C together, or A, B and C together. As defined herein, the term "automatically" means without user intervention.

As defined herein, the term "computer readable storage medium" means a storage medium that contains or stores program code for use by or in connection with an instruction execution system, apparatus, or device. As defined herein, a "computer readable storage medium" is not a transitory, propagating signal per se. A computer readable storage medium may be, but is not limited to, an electronic storage device, a magnetic storage device, an optical storage device, an electromagnetic storage device, a semiconductor storage device, or any suitable combination of the foregoing. Memory elements, as described herein, are examples of a computer readable storage medium. A non-exhaustive list of more specific examples of a computer readable storage medium may include: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing.

As defined herein, the term "loop construct" means one or more instructions of a high level programming language whose execution results in a body portion including one or more other instructions being executed a plurality of times in accordance with loop control variables that are used as parameters for the loop construct instructions. An example of a loop construct is a "for" construct.

As defined herein, the term "control flow construct" means one or more statements or instructions of a high level programming language whose execution results in a choice being made as to which of two or more different dataflow paths are followed. An example of a control flow construct is a conditional branch. A conditional branch refers to the case where statements are executed only when a condition is met or the case where statements are executed until a condition is met. Conditional branches include loops, for next, if-then, if-then-else high level programming language structures or constructs.

As defined herein, the term "coupled" means connected, whether directly without any intervening elements or indirectly with one or more intervening elements, unless otherwise indicated. Two elements may be coupled mechanically, electrically, or communicatively linked through a communication channel, pathway, network, or system. As defined herein, the terms "includes," "including," "comprises," and/or "comprising," specify the presence of stated features, integers, steps, operations, elements, and/or components, but do not preclude the presence or addition of one or more other features, integers, steps, operations, elements, components, and/or groups thereof. As defined herein, the term "output" means storing in physical memory elements, e.g., devices, writing to display or other peripheral output device, sending or transmitting to another system, exporting, or the like. As defined herein, the term "plurality" means two or more than two.

As defined herein, the term "hardware description language" or "HDL" is a computer-language that facilitates the documentation, design, and manufacturing of a digital system, such as an integrated circuit. A hardware description language combines program verification techniques with expert system design methodologies. Using an HDL, for example, a user can design and specify an electronic circuit, describe the operation of the circuit, and create tests to verify operation of the circuit. An HDL includes standard, text-based expressions of the spatial and temporal structure and behavior of the electronic system being modeled. HDL syntax and semantics include explicit notations for expressing concurrency. In contrast to most high level programming languages, an HDL also includes an explicit notion of time, which is a primary attribute of a digital system.

As defined herein, the term "high level programming language" or "HLL" means a programming language, or set of instructions, used to program a data processing system where the instructions have a strong abstraction from the details of the data processing system, e.g., machine language. For example, a high level programming language may automate or hide aspects of operation of the data processing system such as memory management. The amount of abstraction typically defines how "high level" the programming language is. Using a high level programming language frees the user from dealing with registers, memory addresses, and other low level features of the data processing system upon which the high level programming language will execute. In this regard, a high level programming language includes little or no instructions that translate directly, on a one-to-one basis, into a native opcode of a data processing system. Examples of high level programming languages include, but are not limited to, C, C++, SystemC, OpenCL, or the like.

As defined herein, the term "if" means "when" or "upon" or "in response to" or "responsive to," depending upon the context. Thus, the phrase "if it is determined" or "if [a stated condition or event] is detected" may be construed to mean "upon determining" or "in response to determining" or "upon detecting [the stated condition or event]" or "in response to detecting [the stated condition or event]" or "responsive to detecting [the stated condition or event]" depending on the context. As defined herein, the term "responsive to" means responding or reacting readily to an action or event. Thus, if a second action is performed "responsive to" a first action, there is a causal relationship between an occurrence of the first action and an occurrence of the second action. The term "responsive to" indicates the causal relationship.

As defined herein, the term "processor" means at least one hardware circuit configured to carry out instructions contained in program code. The hardware circuit may be an integrated circuit. Examples of a processor include, but are not limited to, a central processing unit (CPU), an array processor, a vector processor, a digital signal processor (DSP), a field-programmable gate array (FPGA), a programmable logic array (PLA), an application specific integrated circuit (ASIC), programmable logic circuitry, and a controller.

In some instances, depending upon the context, the term "signal" is used within this disclosure to describe physical structures such as terminals, pins, signal lines, wires. In other cases, depending upon the context, the term "signal" refers to the conveyance of a single bit, e.g., a single wire, or the conveyance of multiple parallel bits through multiple parallel wires. Further, each signal may represent bi-directional communication between two, or more, components connected by the signal.

A computer program product may include a computer readable storage medium (or media) having computer readable program instructions thereon for causing a processor to carry out aspects of the inventive arrangements described herein. Computer readable program instructions described herein may be downloaded to respective computing/processing devices from a computer readable storage medium or to an external computer or external storage device via a network, for example, the Internet, a LAN, a WAN and/or a wireless network. The network may include copper transmission cables, optical transmission fibers, wireless transmission, routers, firewalls, switches, gateway computers and/or edge devices including edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations for the inventive arrangements described herein may be assembler instructions, instruction-set-architecture (ISA) instructions, machine instructions, machine dependent instructions, microcode, firmware instructions, state-setting data, or either source code or object code written in any combination of one or more programming languages, including an object oriented programming language and/or procedural programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a WAN, or the connection may be made to an external computer (for example, through the Internet using an Internet Service Provider). In some cases, electronic circuitry including, for example, programmable logic circuitry, an FPGA, or a PLA may execute the computer readable program instructions by utilizing state information specified by the computer readable program instructions to personalize the electronic circuitry, in order to perform aspects of the inventive arrangements described herein.

Certain aspects of the inventive arrangements are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, may be implemented by computer readable program instructions, e.g., program code.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the operations specified in the flowchart and/or block diagram block or blocks.

The computer readable program instructions may also be loaded onto a computer, other programmable data processing apparatus, or other device to cause a series of operations to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various aspects of the inventive arrangements. In this regard, each block in the flowchart or block diagrams may represent a module, segment, or portion of instructions, which comprises one or more executable instructions for implementing the specified operations.

In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

The corresponding structures, materials, acts, and equivalents of all means or step plus function elements that may be found in the claims below are intended to include any structure, material, or act for performing the function in combination with other claimed elements as specifically claimed.

A method of implementing circuitry from an application may include partitioning, using a processor, an array of the application into a plurality of virtual blocks according to a streaming dimension of the array and determining, using the processor, that a first function and a second function of the application that access the array have same access patterns for the virtual blocks of the array. The method may include including, using the processor, a FIFO memory within a circuit design implementing the application. The FIFO memory couples a first circuit block implementing the first function with a second circuit block implementing the second function. The method may include including, using the processor, control circuitry within the circuit design. The control circuitry is configured to implement concurrent operation of the first circuit block and the second circuit block by controlling accesses of the first circuit block and the second circuit block to a plurality of buffers in the FIFO memory.

In one aspect, the control circuitry controls access to the FIFO memory by granting exclusive access to the first circuit block and the second circuit block to different ones of the plurality of buffers.

In another aspect, each buffer of the FIFO memory is configured to transfer a virtual block of the array from the first circuit block to the second circuit block. The buffers of the FIFO memory may be sized according to a random access dimension of the array.

The method may include determining flow control regions of the first function and the second function and generating control circuitry to perform handshake signaling at boundaries of the flow control regions of the first function and the second function.

Determining the flow control regions may include determining intra-virtual block accesses for the first function and the second function. The method may include inserting markers at the boundaries of the flow control regions, wherein the markers indicate control circuitry operations regulating access to the plurality of buffers.

A system for implementing circuitry from an application may include a processor configured to initiate executable operations. The executable operations may include partitioning an array of the application into a plurality of virtual blocks according to a streaming dimension of the array and determining that a first function of the application that accesses the array and a second function of the application that accesses the array have same access patterns for the virtual blocks of the array. The executable operations may include including a FIFO memory within a circuit design implementing the application. The FIFO couples a first circuit block implementing the first function with a second circuit block implementing the second function. The executable operations may include including control circuitry within the circuit design. The control circuitry is configured to implement concurrent operation of the first circuit block and the second circuit block by controlling accesses of the first circuit block and the second circuit block to a plurality of buffers in the FIFO memory.

In one aspect, the control circuitry controls access to the FIFO memory by granting exclusive access to the first circuit block and the second circuit block to different ones of the plurality of buffers.

In another aspect, each buffer of the FIFO memory is configured to transfer a virtual block of the array from the first circuit block to the second circuit block. The buffers of the FIFO memory may be sized according to a random access dimension of the array.

The processor may be configured to initiate executable operations further including determining flow control regions of the first function and the second function and generating control circuitry to perform handshake signaling at boundaries of the flow control regions of the first function and the second function.

Determining the flow control regions may include determining intra-virtual block accesses for the first function and the second function.

The processor may be configured to initiate executable operations further including inserting markers at the boundaries of the flow control regions, wherein the markers indicate control circuitry operations regulating access to the plurality of buffers.

A computer program product includes a non-transitory computer readable storage medium having program code stored thereon for implementing circuitry from an application. The program code is executable by a processor to perform operations. The operations may include partitioning, using the processor, an array of the application into a plurality of virtual blocks according to a streaming dimension of the array and determining, using the processor, that a first function of the application that accesses the array and a second function of the application that accesses the array have same access patterns for the virtual blocks of the array. The operations include including, using the processor, a FIFO memory within a circuit design implementing the application, wherein the FIFO memory couples a first circuit block implementing the first function with a second circuit block implementing the second function and including, using the processor, control circuitry within the circuit design. The control circuitry is configured to implement concurrent operation of the first circuit block and the second circuit block by controlling accesses of the first circuit block and the second circuit block to a plurality of buffers in the FIFO memory.

In one aspect, the control circuitry controls access to the FIFO memory by granting exclusive access to the first circuit block and the second circuit block to different ones of the plurality of buffers.

In another aspect, each buffer of the FIFO memory is configured to transfer a virtual block of the array from the first circuit block to the second circuit block.

The program code may be executable by the processor to perform operations further including determining flow control regions of the first function and the second function and generating control circuitry to perform handshake signaling at boundaries of the flow control regions of the first function and the second function.

Determining the flow control regions may include determining intra-virtual block accesses for the first function and the second function.

The program code may be executable by the processor to perform operations further including inserting markers at the boundaries of the flow control regions, wherein the markers indicate control circuitry operations regulating access to the plurality of buffers.

A method of implementing circuitry from an application. The method may include determining, using a processor, a data flow of an application having a producer function, a loop construct, and a consumer function, creating, using the processor, a new function including contents of a body of the loop construct, and generating, using the processor, a circuit design from the application including a producer function circuit block, a new function circuit block, and a consumer function circuit block. The method may include including, within the circuit design and using the processor, control circuitry for each circuit block, wherein the control circuitry of the new function circuit block initiates operation of the new function circuit block according to a loop induction variable of the loop construct.

The method may include canonicalizing the loop induction variable of the loop construct.

In one aspect, the producer function provides data to the loop construct and the consumer function receives data from the loop construct. In that case, including control circuitry for each circuit block may include including control circuitry for the producer circuit block that initiates operation of the producer circuit block one time for each plurality of iterations of the loop construct according to the loop induction variable and including control circuitry for the consumer circuit block that initiates operation of the consumer circuit block one time for each plurality of iterations of the loop construct according to the loop induction variable.

In another aspect, the body of the loop construct includes a first function and a second function, wherein generating a circuit design from the application includes generating, within the new function circuit block, a first sub-circuit block implementation of the first function and a second sub-circuit block implementation of the second function.

The method may include including, within the circuit design, a FIFO memory coupling the first sub-circuit block and the second sub-circuit block, wherein the FIFO memory has a plurality of buffers. The method may also include sizing each buffer of the FIFO memory according to a size of an argument passed from the first function to the second function. The first sub-circuit and the second sub-circuit operate concurrently using the plurality of buffers.

A system for implementing circuitry from an application includes a processor configured to initiate executable operations. The executable operations may include determining a data flow of an application including a producer function, a loop construct, and a consumer function, creating a new function including contents of a body of the loop construct, and generating a circuit design from the application including a producer function circuit block, a new function circuit block, and a consumer function circuit block. The method may include including, within the circuit design, control circuitry for each circuit block, wherein the control circuitry of the new function circuit block initiates operation of the new function circuit block according to a loop induction variable of the loop construct.

The processor may be configured to initiate executable operations further including canonicalizing the loop induction variable of the loop construct.

In one aspect, the producer function provides data to the loop construct and the consumer function receives data from the loop construct. In that case, including control circuitry for each circuit block includes including control circuitry for the producer circuit block that initiates operation of the producer circuit block one time for each plurality of iterations of the loop construct according to the loop induction variable and including control circuitry for the consumer circuit block that initiates operation of the consumer circuit block one time for each plurality of iterations of the loop construct according to the loop induction variable.

In another aspect, the body of the loop construct includes a first function and a second function. In that case, the generating a circuit design from the application includes generating, within the new function circuit block, a first sub-circuit block implementation of the first function and a second sub-circuit block implementation of the second function.

The processor may be configured to initiate executable operations further including, within the circuit design, a FIFO memory coupling the first sub-circuit block and the second sub-circuit block, wherein the FIFO memory has a plurality of buffers.

The processor may be configured to initiate executable operations further including sizing each buffer of the FIFO memory according to a size of an argument passed from the first function to the second function. The first sub-circuit and the second sub-circuit operate concurrently using the plurality of buffers.

A computer program product includes a non-transitory computer readable storage medium having program code stored thereon for implementing circuitry from an application. The program code is executable by a processor to perform operations. The operations may include determining, using the processor, a data flow of an application comprising a producer function, a loop construct, and a consumer function, creating, using the processor, a new function including contents of a body of the loop construct, and generating, using the processor, a circuit design from the application including a producer function circuit block, a new function circuit block, and a consumer function circuit block. The operations may include including, within the circuit design and using the processor, control circuitry for each circuit block. The control circuitry of the new function circuit block initiates operation of the new function circuit block according to a loop induction variable of the loop construct.

The program code may be executable by the processor to perform operations including canonicalizing the loop induction variable of the loop construct.

In one aspect, the producer function provides data to the loop construct and the consumer function receives data from the loop construct. In that case, including control circuitry for each circuit block may include including control circuitry for the producer circuit block that initiates operation of the producer circuit block one time for each plurality of iterations of the loop construct according to the loop induction variable and including control circuitry for the consumer circuit block that initiates operation of the consumer circuit block one time for each plurality of iterations of the loop construct according to the loop induction variable.

In another aspect, the body of the loop construct includes a first function and a second function. In that case, generating a circuit design from the application includes generating, within the new function circuit block, a first sub-circuit block implementation of the first function and a second sub-circuit block implementation of the second function.

The program code may be executable by the processor to perform operations such as including, within the circuit design, a FIFO memory coupling the first sub-circuit block and the second sub-circuit block, wherein the FIFO memory has a plurality of buffers. The first sub-circuit and the second sub-circuit further may operate concurrently using the plurality of buffers.

The description of the inventive arrangements provided herein is for purposes of illustration and is not intended to be exhaustive or limited to the form and examples disclosed. The terminology used herein was chosen to explain the principles of the inventive arrangements, the practical application or technical improvement over technologies found in the marketplace, and/or to enable others of ordinary skill in the art to understand the inventive arrangements disclosed herein. Modifications and variations may be apparent to those of ordinary skill in the art without departing from the scope and spirit of the described inventive arrangements. Accordingly, reference should be made to the following claims, rather than to the foregoing disclosure, as indicating the scope of such features and implementations.

What is claimed is:

1. A method of implementing circuitry from an application, the method comprising:
   determining, using a processor, a data flow of an application comprising a producer function, a loop construct, and a consumer function;
   creating, using the processor, a new function including contents of a body of the loop construct;
   generating, using the processor, a circuit design from the application including a producer function circuit block, a new function circuit block, and a consumer function circuit block; and
   including, within the circuit design and using the processor, control circuitry for each circuit block, wherein the control circuitry of the new function circuit block initiates operation of the new function circuit block according to a loop induction variable of the loop construct.

2. The method of claim 1, further comprising:
canonicalizing the loop induction variable of the loop construct.

3. The method of claim 1, wherein the producer function provides data to the loop construct and the consumer function receives data from the loop construct, wherein the including control circuitry for each circuit block comprises:
including control circuitry for the producer function circuit block that initiates operation of the producer function circuit block one time for each plurality of iterations of the loop construct according to the loop induction variable; and
including control circuitry for the consumer function circuit block that initiates operation of the consumer function circuit block one time for each plurality of iterations of the loop construct according to the loop induction variable.

4. The method of claim 1, wherein the body of the loop construct comprises a first function and a second function, wherein the generating a circuit design from the application comprises:
generating, within the new function circuit block, a first sub-circuit block implementation of the first function and a second sub-circuit block implementation of the second function.

5. The method of claim 4, further comprising:
including, within the circuit design, a first-in-first-out memory coupling the first sub-circuit block and the second sub-circuit block, wherein the first-in-first-out memory comprises a plurality of buffers.

6. The method of claim 5, further comprising:
sizing each buffer of the first-in-first-out memory according to a size of an argument passed from the first function to the second function.

7. The method of claim 5, wherein the first sub-circuit and the second sub-circuit operate concurrently using the plurality of buffers.

8. A system for implementing circuitry from an application, the system comprising:
a processor configured to initiate executable operations comprising:
determining a data flow of an application comprising a producer function, a loop construct, and a consumer function;
creating a new function including contents of a body of the loop construct;
generating a circuit design from the application including a producer function circuit block, a new function circuit block, and a consumer function circuit block; and
including, within the circuit design, control circuitry for each circuit block, wherein the control circuitry of the new function circuit block initiates operation of the new function circuit block according to a loop induction variable of the loop construct.

9. The system of claim 8, wherein the processor is configured to initiate executable operations further comprising:
canonicalizing the loop induction variable of the loop construct.

10. The system of claim 8, wherein the producer function provides data to the loop construct and the consumer function receives data from the loop construct, wherein the including control circuitry for each circuit block comprises:
including control circuitry for the producer function circuit block that initiates operation of the producer function circuit block one time for each plurality of iterations of the loop construct according to the loop induction variable; and
including control circuitry for the consumer function circuit block that initiates operation of the consumer function circuit block one time for each plurality of iterations of the loop construct according to the loop induction variable.

11. The system of claim 8, wherein the body of the loop construct comprises a first function and a second function, wherein the generating a circuit design from the application comprises:
generating, within the new function circuit block, a first sub-circuit block implementation of the first function and a second sub-circuit block implementation of the second function.

12. The system of claim 11, wherein the processor is configured to initiate executable operations further comprising:
including, within the circuit design, a first-in-first-out memory coupling the first sub-circuit block and the second sub-circuit block, wherein the first-in-first-out memory comprises a plurality of buffers.

13. The system of claim 12, wherein the processor is configured to initiate executable operations further comprising:
sizing each buffer of the first-in-first-out memory according to a size of an argument passed from the first function to the second function.

14. The system of claim 12, wherein the first sub-circuit and the second sub-circuit operate concurrently using the plurality of buffers.

15. A computer program product comprising a non-transitory computer readable storage medium having program code stored thereon for implementing circuitry from an application, the program code, when executed by a processor to perform operations comprising:
determining, using the processor, a data flow of an application comprising a producer function, a loop construct, and a consumer function;
creating, using the processor, a new function including contents of a body of the loop construct;
generating, using the processor, a circuit design from the application including a producer function circuit block, a new function circuit block, and a consumer function circuit block; and
including, within the circuit design and using the processor, control circuitry for each circuit block, wherein the control circuitry of the new function circuit block initiates operation of the new function circuit block according to a loop induction variable of the loop construct.

16. The computer program product of claim 15, wherein the program code is executable by the processor to perform operations further comprising:
canonicalizing the loop induction variable of the loop construct.

17. The computer program product of claim 15, wherein the producer function provides data to the loop construct and the consumer function receives data from the loop construct, wherein the including control circuitry for each circuit block comprises:
including control circuitry for the producer function circuit block that initiates operation of the producer function circuit block one time for each plurality of iterations of the loop construct according to the loop induction variable; and including control circuitry for the consumer function circuit block that initiates operation of the consumer function circuit block one time for each plurality of iterations of the loop construct according to the loop induction variable.

18. The computer program product of claim 15, wherein the body of the loop construct comprises a first function and a second function, wherein the generating a circuit design from the application comprises:

generating, within the new function circuit block, a first sub-circuit block implementation of the first function and a second sub-circuit block implementation of the second function.

19. The computer program product of claim 18, wherein the program code is executable by the processor to perform operations further comprising:

including, within the circuit design, a first-in-first-out memory coupling the first sub-circuit block and the second sub-circuit block, wherein the first-in-first-out memory comprises a plurality of buffers.

20. The computer program product of claim 18, wherein the first sub-circuit and the second sub-circuit operate concurrently using the plurality of buffers.

* * * * *